(12) United States Patent
Inoue et al.

(10) Patent No.: US 10,756,233 B2
(45) Date of Patent: *Aug. 25, 2020

(54) METHOD OF MANUFACTURING A LIGHT EMITTING ELEMENT

(71) Applicant: NICHIA CORPORATION, Anan-shi, Tokushima (JP)

(72) Inventors: Naoto Inoue, Anan (JP); Sho Kusaka, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/678,169

(22) Filed: Nov. 8, 2019

(65) Prior Publication Data

US 2020/0075794 A1 Mar. 5, 2020

Related U.S. Application Data

(63) Continuation of application No. 16/125,240, filed on Sep. 7, 2018, now Pat. No. 10,516,075.

(30) Foreign Application Priority Data

Sep. 11, 2017 (JP) .................................. 2017-174026
Aug. 28, 2018 (JP) .................................. 2018-159209

(51) Int. Cl.
*H01L 33/00* (2010.01)
*B23K 26/53* (2014.01)
(Continued)

(52) U.S. Cl.
CPC ........ *H01L 33/005* (2013.01); *B23K 26/0006* (2013.01); *B23K 26/53* (2015.10);
(Continued)

(58) Field of Classification Search
CPC ............ B23K 2103/56; B23K 26/0006; B23K 26/53; H01L 21/78; H01L 2933/0033; H01L 33/005
(Continued)

(56) References Cited

U.S. PATENT DOCUMENTS 10,516,075 B2 * 12/2019 Inoue ..................... B23K 26/53
2007/0287267 A1 12/2007 Sakamoto et al.
(Continued)

FOREIGN PATENT DOCUMENTS

JP 2005-286218 A 10/2005
JP 2008-078440 A 4/2008
(Continued)

OTHER PUBLICATIONS

Notice of Allowance on U.S. Appl. No. 16/125,240 dated Aug. 12, 2019.
Notice of Allowance on U.S. Appl. No. 16/125,240 dated Sep. 11, 2019.

*Primary Examiner* — Long K Tran
(74) *Attorney, Agent, or Firm* — Foley & Lardner LLP

(57) ABSTRACT

A method of manufacturing a light emitting element includes: providing a wafer comprising: a sapphire substrate having a first face and a second face, and a semiconductor structure disposed on the second face; irradiating the substrate with a laser beam to form a plurality of modified regions in the substrate; and subsequently, separating the wafer into a plurality of light emitting elements.

20 Claims, 7 Drawing Sheets

(51) Int. Cl.
*B23K 26/00* (2014.01)
*H01L 21/78* (2006.01)
*B23K 103/00* (2006.01)

(52) U.S. Cl.
CPC .......... *H01L 21/78* (2013.01); *B23K 2103/56* (2018.08); *H01L 2933/0033* (2013.01)

(58) Field of Classification Search
USPC .......................................................... 438/22
See application file for complete search history.

(56) References Cited

U.S. PATENT DOCUMENTS

| | | |
|---|---|---|
| 2008/0283848 A1 | 11/2008 | Yamazaki |
| 2009/0002589 A1 | 1/2009 | Tanada |
| 2011/0287608 A1 | 11/2011 | Saegusa et al. |
| 2014/0004639 A1 | 1/2014 | Sato |
| 2015/0221816 A1 | 8/2015 | Tajikara et al. |

FOREIGN PATENT DOCUMENTS

| | | |
|---|---|---|
| JP | 5119463 B2 | 1/2013 |
| JP | 2014-011358 A | 1/2014 |
| JP | 2014-041924 A | 3/2014 |
| JP | 2015-029039 A | 2/2015 |
| JP | 2017-084923 A | 5/2017 |
| WO | WO-2012/029735 A1 | 3/2012 |

\* cited by examiner

METHOD OF MANUFACTURING A LIGHT EMITTING ELEMENT

CROSS-REFERENCE TO RELATED APPLICATIONS

This application is a continuation of U.S. patent application Ser. No. 16/125,240, filed Sep. 7, 2018, which claims priority to Japanese Patent Application No. 2017-174026, filed on Sep. 11, 2017, and Japanese Patent Application No. 2018-159209, filed on Aug. 28, 2018, the entire contents of which are incorporated herein by reference.

BACKGROUND

The present disclosure relates to a method of manufacturing a light emitting element.

In a method of manufacturing a light emitting element in which a compound semiconductor including an emission layer is layered on a substrate, a method of forming element separation lines by irradiating a substrate with a laser has been proposed, for example, in Japanese Patent Publication No. 5119463. There is a need to improve production efficiency in a method of manufacturing light emitting elements.

SUMMARY

The present disclosure provides a light emitting element manufacturing method that can improve production efficiency.

According to one embodiment, a method of manufacturing a light emitting element includes: providing a wafer comprising a substrate having a first face and a second face, and a semiconductor structure disposed on the second face; irradiating the substrate with a laser beam to form a plurality of modified regions in the substrate; and subsequently, separating the wafer into a plurality of light emitting elements. The irradiating the substrate with a laser beam comprises: performing a first irradiation step comprising irradiating the laser beam along a plurality of first lines that extend in a first direction that is parallel to the first face and that are aligned in a second direction that is parallel to the first face and intersects the first direction; and subsequent to performing the first irradiation step, performing a second irradiation step comprising irradiating the laser beam along second lines that extend in the second direction. The irradiating in the first irradiation step is performed at a plurality of positions along the first direction using a first irradiation pitch of 2.5 µm or less for the positions along the first direction, and a pitch of at least 0.7 mm for the first lines aligned in the second direction.

According to certain embodiment of the present disclosure, a light emitting element manufacturing method that can increase production efficiency can be provided.

DETAILED DESCRIPTION

Figure 1:
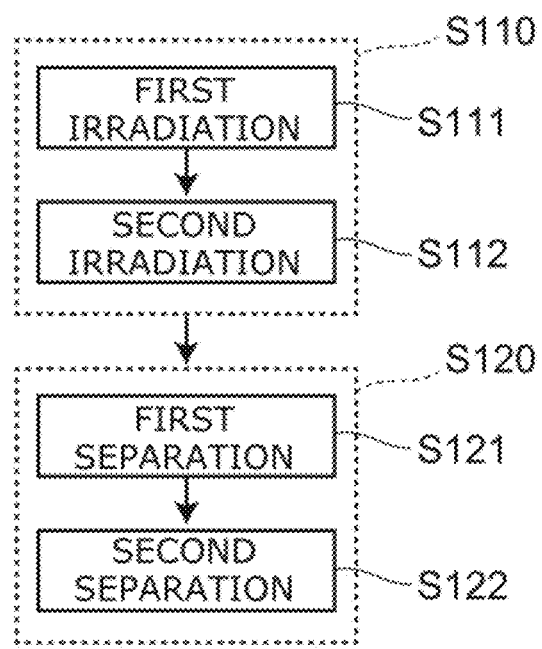
FIG. 1 is a flowchart for the light emitting element manufacturing method according to one embodiment.

Embodiments of the present disclosure will be explained below with reference to the accompanying drawings.

The drawings are schematic or conceptual, and the relationship between the thickness and the width of each part, the size ratios of the parts, and the like are not necessarily the same as those in reality. Even for the same parts, the sizes or the ratios might occasionally differ depending on the drawing.

The same reference numerals denote the elements similar to those described with reference to a previously used drawing, for which detailed explanations will be omitted when appropriate.

FIG. 1 is a flowchart for a light emitting element manufacturing method according to one embodiment.

Figure 2:
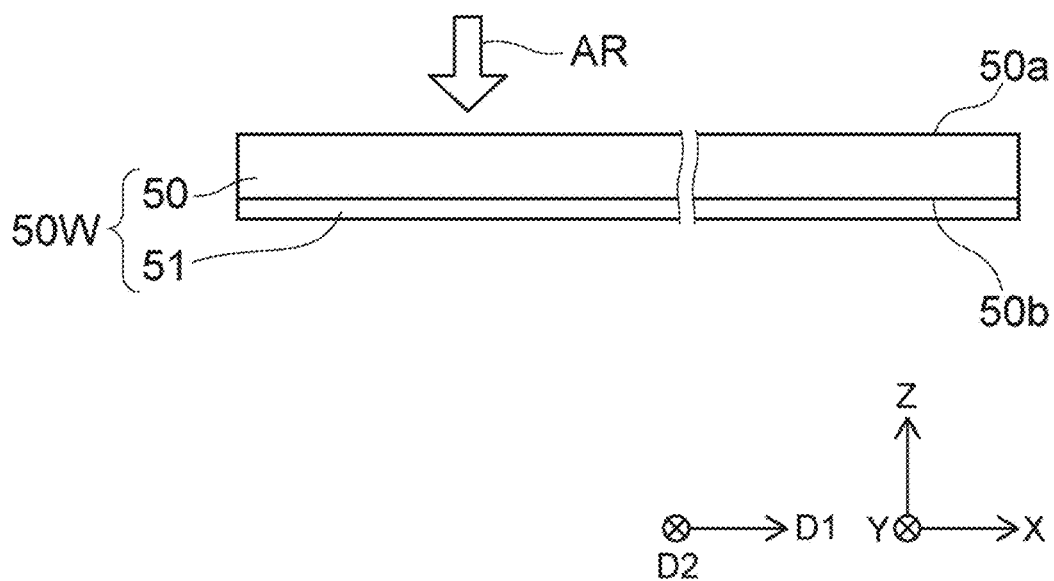
FIG. 2 is a schematic diagram illustrating a wafer used in the light emitting element manufacturing method according to the embodiment.
Figure 3:
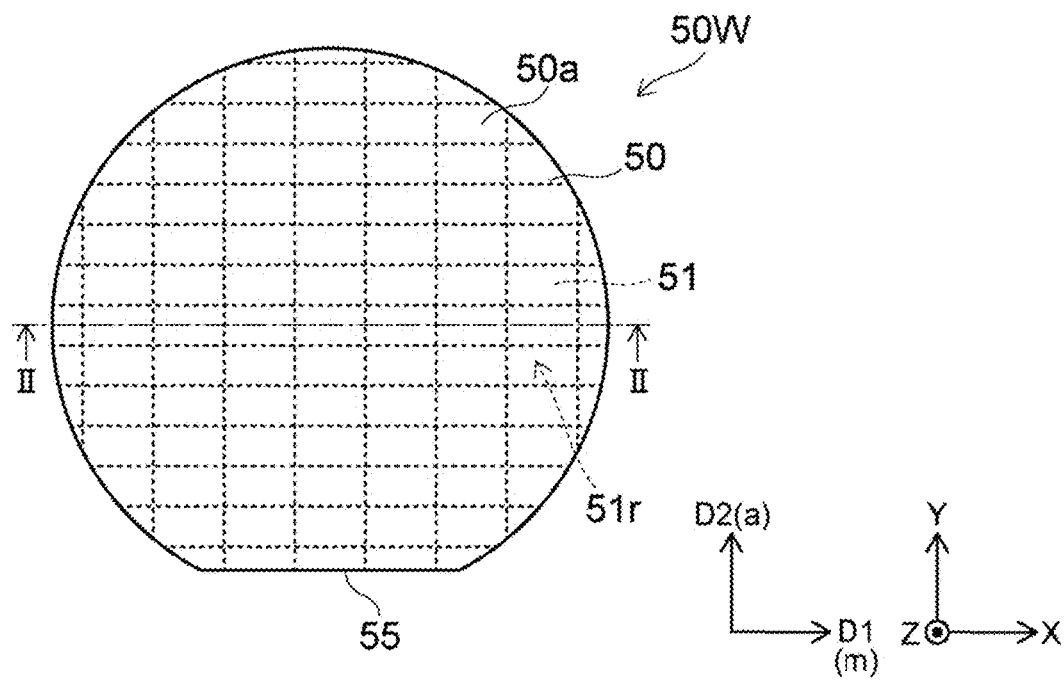
FIG. 3 is a schematic diagram illustrating a wafer used in the light emitting element manufacturing method according to the embodiment.

FIG. 2 and FIG. 3 are schematic diagrams illustrating a wafer used in the light emitting element manufacturing method according to this embodiment. FIG. 2 is a sectional view taken along line II-II in FIG. 3. FIG. 3 is a plan view when the wafer is viewed in the direction indicated by arrow AR in FIG. 2.

As shown in FIG. 1, the light emitting element manufacturing method according to one embodiment includes a laser beam irradiation step (step S110) and a separation step (step S120). The laser beam irradiation step includes a first irradiation step (step S111) and a second irradiation step (step S112). The separation step includes a first separation step (step S121) and a second separation step (step S122).

In the laser irradiation step, a wafer is irradiated with a laser beam. An example of a wafer will be explained below.

As shown in FIG. 2 and FIG. 3, the wafer 50W includes a substrate 50 and a semiconductor structure 51. The substrate 50 has a first face 50a and a second face 50b. The second face 50b is the face opposite the first 50a. The semiconductor structure 51 is disposed, for example, on the second face 50b.

The semiconductor structure 51 includes, for example, an n-type semiconductor layer, an active layer, and a p-type semiconductor layer. The n-type semiconductor layer is positioned between the p-type semiconductor layer and the substrate 50. The active layer is positioned between the p-type semiconductor layer and the n-type semiconductor layer. The semiconductor structure 51 includes, for example, a nitride semiconductor, such as $In_xAl_yGa_{1-x-y}N$ (0≤x, 0≤y, x+y<1). The peak wavelength of the light emitted by the active layer is, for example, in a range of from 360 nm to 650 nm.

The direction from the second face 50b to the first face 50a is the Z-axis direction. The X-axis direction is a direction perpendicular to the Z-axis direction. The Y-axis direction is perpendicular to both the Z-axis and X-axis directions. The first face 50a and the second face 50b extend along the X-Y plane. The Z-axis direction corresponds to the direction of thickness (e.g., depth direction) of the substrate 50.

As shown in FIG. 3, the semiconductor structure 51 includes, for example, a plurality of regions 51r. Each region 51r corresponds to a light emitting element. The regions 51r are arranged in a first direction D1 and a second direction D2.

The first direction D1 is parallel to the first face 50a. The second direction D2 is parallel to the first face 50a and intersects with the first direction D1. The second direction D2, for example, is perpendicular to the first direction D1. In this example, the first direction D1 extends along the X-axis direction. The second direction D2 extends along the Y-axis direction.

The substrate 50 is made of, for example, sapphire. The substrate 50 is, for example, a sapphire substrate (e.g., c-plane sapphire substrate). In the substrate 50, the first face 50a may be oblique to c-plane. When the substrate 50 is a sapphire substrate, the first direction D1 extends along the m-axis of the sapphire substrate, for example. At this time, the second direction D2 extends along the a-axis of the sapphire substrate.

The substrate 50 has an orientation flat 55. In this example, the orientation flat 55 extends along the first direction D1 of the wafer 50W. In the present embodiment, the relationship between the first direction D1 and the direction in which the orientation flat 55 extends can be appropriately selected. The relationship between the second direction D2 and the direction in which the orientation flat 55 extends can be appropriately selected.

Such a wafer 50W is irradiated with a laser beam. The wafer 50W is separated along the borders of the regions 51r. A plurality of light emitting elements thus result from the regions 51r.

Figure 4:
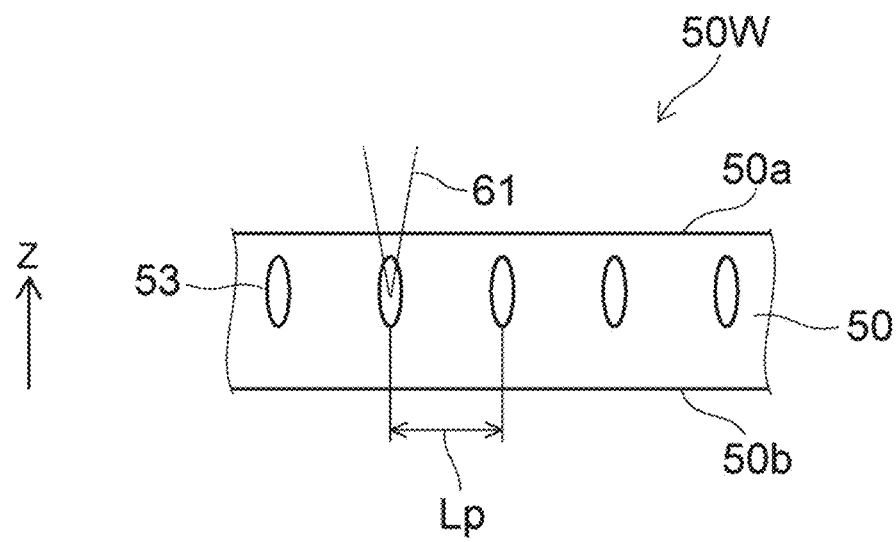
FIG. 4 is a schematic diagram illustrating part of the light emitting element manufacturing method according to the embodiment.

FIG. 4 is a schematic diagram illustrating part of the light emitting element manufacturing method according to the present embodiment.

FIG. 4 illustrates laser beam irradiation. As shown in FIG. 4, the substrate 50 of the wafer 50W is irradiated with a laser beam 61. In this example, the laser beam 61 enters the substrate 50 from the first face 50a.

The laser beam 61 is applied in the form of pulsed laser irradiation. As a laser light source, for example, a Nd:YAG laser, titanium sapphire laser, Nd:YVO4 laser, Nd:YLF laser, or the like is used. The wavelength of the laser beam 61 is a wavelength of light capable of transmitting through the substrate 50. The laser beam 61, for example, is a laser beam having a peak wavelength in a range of from 800 nm to 1200 nm.

The laser beam 61 is irradiated along the direction being parallel the X-Y plane. For example, the positions of the laser beam 61 relative to the substrate 50 are changed along the direction in parallel to the X-Y plane. The positions of the focal spots of the laser beam 61 along the Z-axis direction (positions using the substrate 50 as a reference) may be changeable.

For example, discrete laser beam irradiation is performed in a first direction along the first face 50a of the substrate 50. The irradiated positions of the laser beam 61 are apart from one another along the first direction. The laser beam irradiated positions line up at laser irradiation pitches Lp. The laser irradiation pitch Lp corresponds to the pitch of the laser beam 61 between shots.

The laser beam 61 irradiation generates a plurality of modified regions 53 in the substrate 50. The laser beam 61 is focused inside the substrate 50. The energy of the laser beam 61 concentrates at a specific depth in the substrate 50. This generates the modified regions 53. The pitches for the focal spots of the laser beam 61 when generating the modified regions 53 correspond to the laser irradiation pitches Lp. The modified regions 53 are, for example, regions embrittled by laser irradiation inside the substrate 50.

For example, cracks develop from the modified regions 53. The cracks extend along the Z-axis direction of the substrate 50. The cracks become the separation starting point of the substrate 50. For instance, a force (e.g., mechanical load or shock) is applied in the separation step described below. This can achieve separation of the substrate 50 based on the cracks.

As described above, in the laser beam irradiation step (step S110), the substrate 50 is irradiated with a laser beam 61 to generate a plurality of modified regions 53 inside the substrate 50. Laser irradiation is performed, for example, along the first direction D1 and the second direction D2.

In the separation step (step S120), the wafer 50 is separated into a plurality of light emitting elements subsequent to the laser beam irradiation step. For example, by separating the wafer 50W along two directions, the wafer is separated into a plurality of light emitting elements.

An example of the laser beam irradiation step will be explained below.

Figure 5:
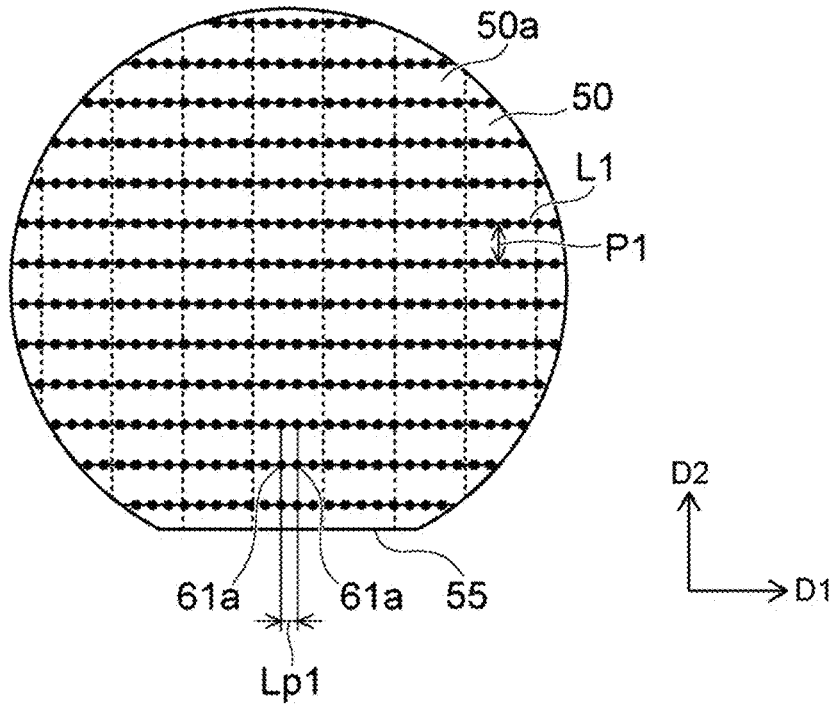
FIG. 5 is a schematic plan view illustrating part of the light emitting element manufacturing method according to the embodiment.

FIG. 5 is a schematic plan view illustrating part of the light emitting element manufacturing method according to the present embodiment.

FIG. 5 illustrates a first irradiation step (step S111). As shown in FIG. 5, in the first irradiation step, the laser beam 61 is applied along multiple first lines L1.

The first lines L1 extend along the first direction D1 and are aligned in the second direction D2. As explained above, the first direction D1 is parallel the first face 50a. The second direction D2 is parallel the first face 50a and intersects with the first direction D1. The first lines L1 are aligned with first pitches P1. The first pitch P1 along the second direction D2 is the distance between two adjacent first lines L1 aligned in the second direction D2. In the present embodiment, the first pitch P1, for example, is at least 0.7 mm. The first pitch P1 is preferably in a range of from 0.7 mm to 3 mm, more preferably from 0.9 mm to 2.5 mm, yet more preferably from 1 mm to 2 mm.

The first lines L1, for example, extend along the borders between the regions 51r (see FIG. 3) aligned in the second direction D2.

As shown in FIG. 5, in performing laser beam 61 irradiation along one of the multiple first lines L1, the laser beam 61 is irradiated at a plurality of first positions 61a. The first positions 61a line up along the first direction D1. The pitches for the first positions 61a correspond to the first irradiation pitches Lp1. In the first irradiation pitches Lp1, two adjacent first positions 61a in the first direction D1 line up along the first direction D1.

The first irradiation pitch Lp1, for example, is 2.5 µm at most, preferably 2.0 µm at most, more preferably 1.5 µm at most.

Figure 6:
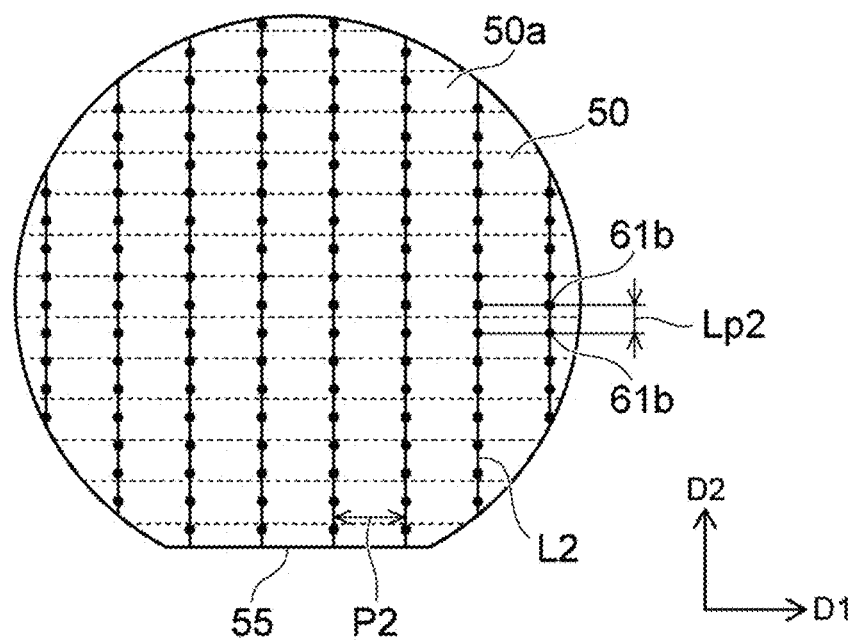
FIG. 6 is a schematic plan view illustrating part of the light emitting element manufacturing method according to the embodiment.

FIG. 6 is a schematic plan view illustrating part of the light emitting element manufacturing method according to the present embodiment.

FIG. 6 illustrates a second irradiation step (step S112). As shown in FIG. 6, in the second irradiation step, a laser beam 61 is applied along a plurality of second lines L2.

The second lines L2 extend along the second direction D2. The second lines L2 are aligned in the first direction D1 with a second pitch P2. The second pitch P2 is the distance between two adjacent second lines L2 aligned in the first direction D1.

The second lines L2, for example, extend along the borders between the regions 51r aligned in the first direction D1 (see FIG. 3).

In performing laser beam 61 irradiation along one of the multiple second lines L2 in the second irradiation step, the laser beam 61 is irradiated at a plurality of second positions 61b. The second positions 61b line up along the second direction D2. The pitches for the second positions 61b corresponds to second irradiation pitches Lp2. In the second irradiation pitches Lp2, two adjacent second positions 61b in the second direction D2 line up along the second direction D2.

In one example, the first irradiation pitch Lp1 is smaller than the second irradiation pitch Lp2.

In one example, the first pitch P1 (see FIG. 5) is smaller than the second pitch P2 (see FIG. 6). The first pitch P1 may be larger than the second pitch P2, or the first pitch P1 and the second pitch P2 may be made equal.

An example of the separation step will be explained below.

Figure 7:
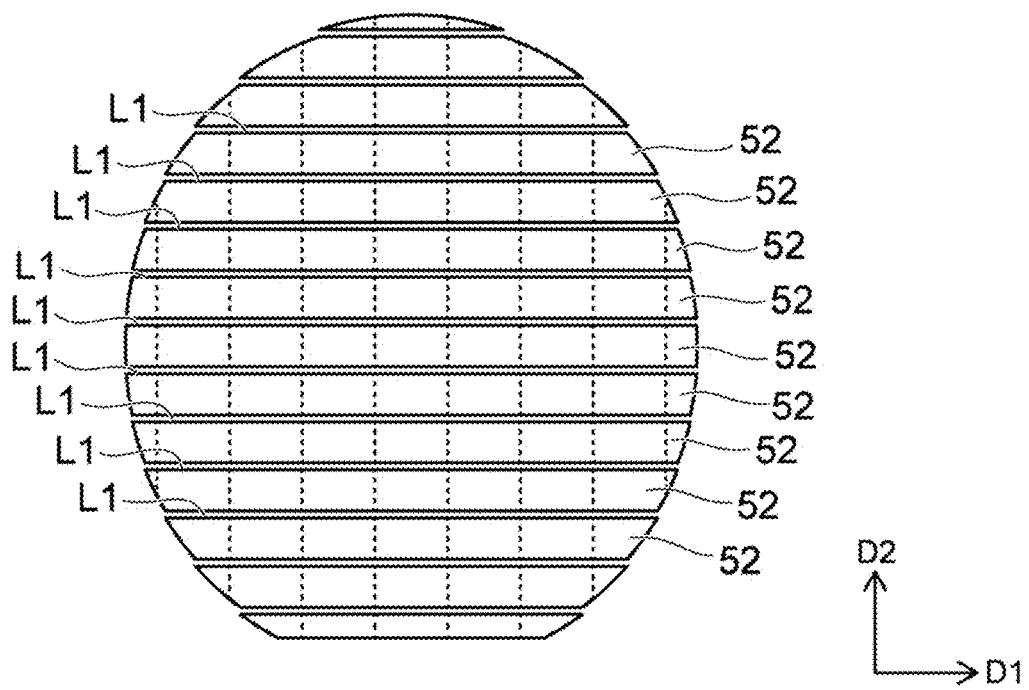
FIG. 7 is a schematic plan view illustrating part of the light emitting element manufacturing method according to the embodiment.

FIG. 7 is a schematic plan view illustrating part of the light emitting element manufacturing method according to the present embodiment.

FIG. 7 illustrates a first separation step. In the first separation step, the wafer 50W is separated into multiple bars 52 along the first lines L1. This separation step of the wafer 50W into the multiple bars 52 can be achieved by, for example, applying a load to the wafer 50W along the first lines L1 using a blade. In this embodiment, each bar 52 includes a plurality of regions 51r lined up along the first direction D1.

Figure 8:
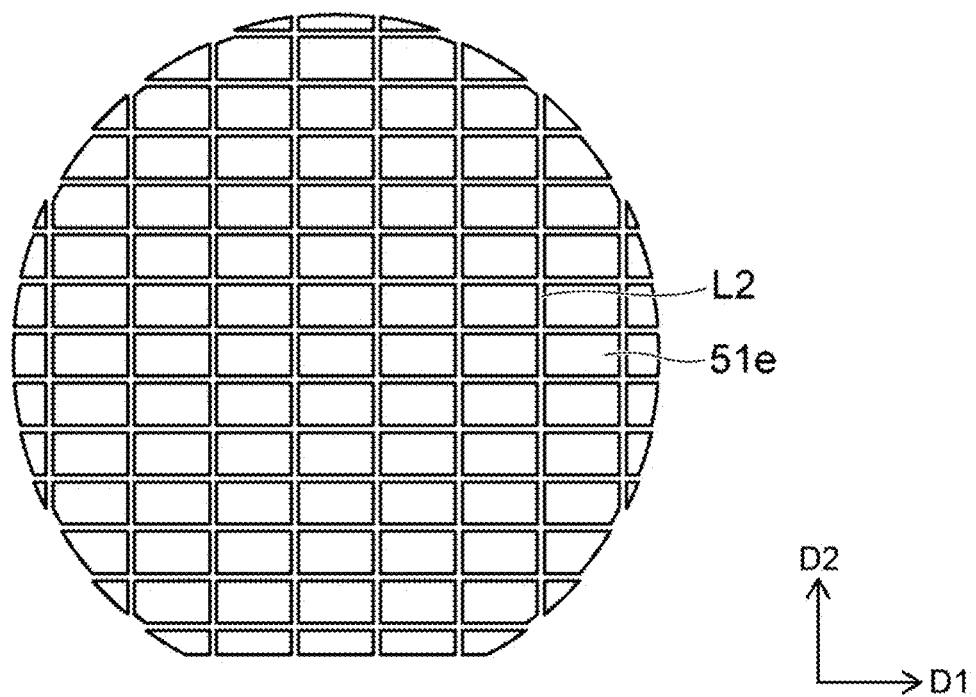
FIG. 8 is a schematic plan view illustrating part of the light emitting element manufacturing method according to the embodiment.

FIG. 8 is a schematic plan view illustrating part of the light emitting element manufacturing method according to the present embodiment.

FIG. 8 illustrates a second separation step. The second separation step is performed after the first separation step. In the second separation step, the bars 52 is separated along the second lines L2 into a plurality of light emitting elements 51e subsequent to the first separation step. This dividing step of the bars 52 into light emitting elements 51e can be achieved by, for example, by applying a load to the bars 52 (i.e., wafer 50W) along the second lines L2 using a blade.

The separation described above can be executed, for example, by cutting.

As previously explained, in one example, the first pitch P1 is smaller than the second pitch P2. In each of the light emitting elements 51e resulting from the manufacturing method described above, the length along the first direction D1 is larger than the length along the second direction D2. Each light emitting element 51e has long sides and short sides. The length of the long side substantially corresponds to the second pitch P2. The short side length corresponds to the first pitch P1.

As described above, in the laser beam irradiation step, the first irradiation step (step S111) and the second irradiation step (step S112) are performed. It was found that there were occasions where the substrate 50 (i.e., wafer 50W) was irradiated with the laser beam 61 under undesirable conditions when performing the second irradiation step subsequent to the first irradiation step. Such an example will be explained below.

Figure 9:
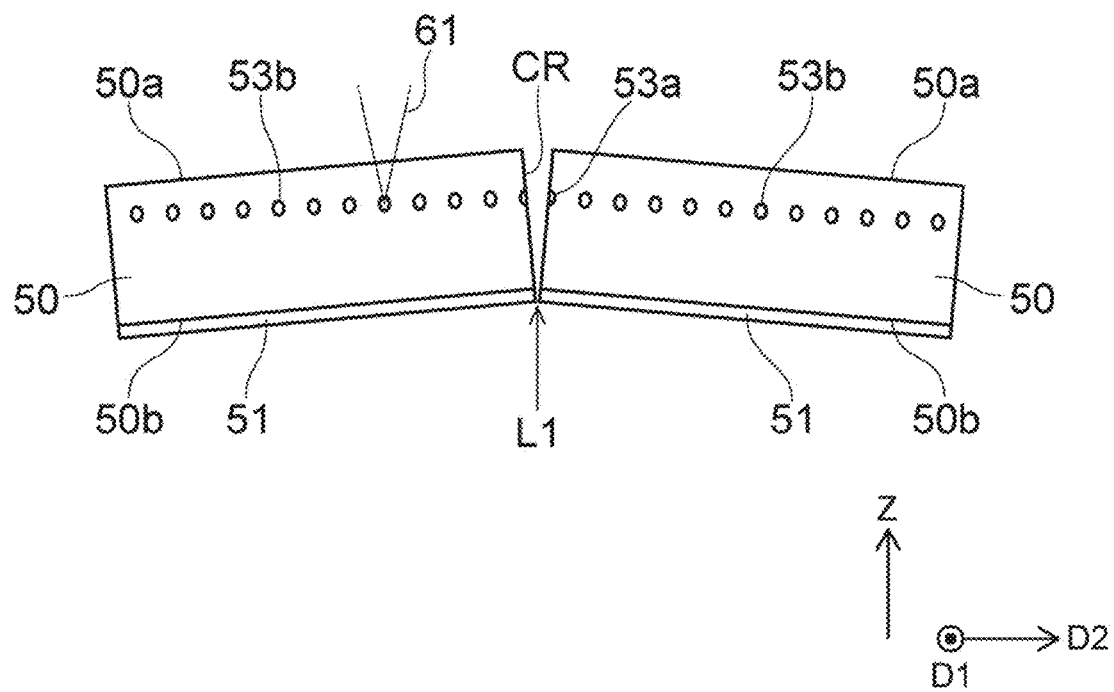
FIG. 9 is a schematic sectional view illustrating part of a light emitting element manufacturing method.

FIG. 9 is a schematic sectional view illustrating part of a light emitting element manufacturing method.

FIG. 9 illustrates a substrate 50 being subjected to laser beam 61 irradiation during a second irradiation step subsequent to the first irradiation step. In this example, the first irradiation step has been performed under inappropriate conditions.

As shown in FIG. 9, in the first irradiation step, a laser beam 61 is irradiated along the first lines L1. This generates a plurality of modified regions 53a inside the substrate 50. FIG. 9 shows a sectional view along a plane that includes the second direction D2 and the Z-axis direction. One of the modified regions 53a is shown on this plane. The modified regions 53a line up along the first direction D1.

When the irradiation conditions for the laser beam 61 are appropriate, a plurality of modified regions 53a are formed in the substrate 50 and cracks CR occur in the substrate 50. However, a principal face (e.g., the first face 50a) of the substrate 50 is continuous, remaining as a single plane. That is, the laser beam 61 irradiation alone does not allow the substrate 50 to be separated by using a crack CR as a starting point. Cracks CR occur using the modified regions 53 as starting points.

On the other hand, when the irradiation conditions for the laser beam 61 are inappropriate, a plurality of modified regions 53a are formed in the substrate 50, cracks CR occur in the substrate 50, and the cracks CR allow the first face 50a of the substrate 50 to separate using the first line L1 as the dividing line. Thus, the two first faces 50a are separated from one another, and thus not continuous. The two first faces 50a are oblique to one another. As such, when the irradiation conditions for the laser beam 61 are inappropriate, an unintended split can occur in the substrate 50.

Because of such an unintended split, the first faces 50a of the substrate 50 are not flat. A split makes the first faces 50a oblique. Performing the second irradiation step in this state results in inconstant depth positions for the focal points of the laser beam 61 in the substrate 50. This results in inconstant depth positions for the modified regions 53b formed in the second irradiation step.

As shown in FIG. 9, for example, in the regions near the crack CR, the positions of the modified regions 53b are deep. On the other hand, in the regions distant from the crack CR, the positions of the modified regions 53b are shallow. This makes it difficult to perform separation based on the second irradiation step (i.e., the second separation step) under desired conditions. For example, failures readily occur thereby readily reducing the production yield and making it difficult to sufficiently increase production efficiency. In the regions near the crack CR, the focal positions of the laser beam 61 are closer to the semiconductor structure 51. This allows the laser beam 61 to damage the semiconductor structure 51.

As described above, it was found that when the first irradiation step conditions are inappropriate, unintended splits can occur to thereby unlikely to allow the second irradiation step to be performed under appropriate conditions.

In this embodiment, appropriate conditions are used in the first irradiation step. This can reduce the occurrence of, for example, unintended splits. Accordingly, the second irradiation step can be performed under appropriate conditions. This can provide a light emitting element manufacturing method that can increase production efficiency.

The test results related to the first irradiation step conditions will be explained below.

In the test, a sapphire substrate having a thickness of 200 μm was used as the substrate 50. The samples each had a square planar shape which is 10.2 mm in length per side. The samples were irradiated with a laser beam 61 in the center while varying the irradiation conditions. The laser beam 61 was irradiated along the m-axis of the sapphire substrates. After irradiating the laser beam 61, the breaking strength of each sample was measured. In measuring the breaking strength, a head pressing speed of 0.05 mm/sec. was used.

For sample SP11, the laser beam 61 power was 3.5 μJ and the laser irradiation pitch Lp was 1.5 μm. The laser pulse width used for sample SP11 was 5.0 ps.

For sample SP12, the laser beam 61 power was 3.5 μJ and the laser irradiation pitch Lp was 2.0 μm. The laser pulse width used for sample SP12 was 5.0 ps.

For sample SP13, the laser beam 61 power was 3.5 μJ and the laser irradiation pitch Lp was 2.5 μm. The laser pulse width used for sample SP13 was 5.0 ps.

For sample SP14, the laser beam 61 power was 3.5 μJ and the laser irradiation pitch Lp was 3.0 μm. The laser pulse width used for sample SP14 was 5.0 ps.

As described above, for samples SP11 to SP14, among the laser beam 61 irradiation conditions, values of the power and laser pulse width used were the same, but the values of the laser irradiation pitch were varied.

Figure 10:
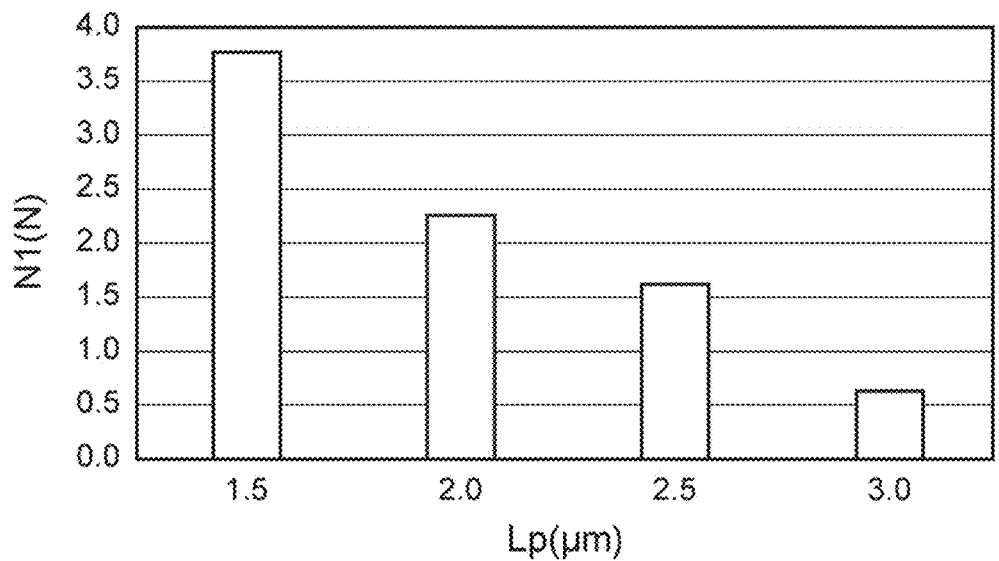
FIG. 10 is a graph showing an example of test results related to a light emitting element manufacturing method.

FIG. 10 is a graph showing the test results related to the light emitting element manufacturing method.

The vertical axis of the graph in FIG. 10 represents breaking strength N1 (newton: N). FIG. 10 shows the breaking strength N1 of the samples SP11 to SP14 described above. The breaking strength N1 of samples SP11 to SP14 were each measured three times, and those shown in FIG. 10 are the average values of the measurements. The breaking strength N1 of sample SP11 was 3.8 N. The breaking strength N1 of sample SP12 was 2.3 N. The breaking strength N1 of sample SP13 was 1.6 N. The breaking strength N1 of sample SP14 was 0.6 N.

As is understood from FIG. 10, the breaking strength N1 heavily depends on the laser irradiation pitch Lp. Reducing the laser irradiation pitch Lp can achieve a high level of breaking strength. In the test described above, the sapphire substrate was irradiated with the laser beam 61 along the m-axis. It is believed that similar results to those shown in FIG. 10 can be achieved even when the sapphire substrates are irradiated with the laser beam 61 along, for example, the a-axis.

For instance, when the breaking strength N1 is relatively low as in the case of sample SP14, an unintended split occurs in the substrate 50 after performing the first irradiation step. On the other hand, when the breaking strength N1 is high, the occurrence of an unintended split in the substrate 50 following the first irradiation step can be reduced.

Reducing the laser irradiation pitch Lp can achieve a high level of breaking strength N1. For example, when the laser irradiation pitch Lp is 1.5 μm at most, a breaking strength N1 higher than 3.8 N can be achieved. This can further reduce the occurrence of an unintended split in the substrate 50 after performing the first irradiation step.

When the laser irradiation pitch Lp was set larger than a predetermined value, the formed cracks were less likely to connect with one another, making the substrate 50 less likely to split. The present inventors therefore previously believed that a reduced laser irradiation pitch would make the substrate 50 more prone to splitting. However, as described above, it was found that a reduced laser irradiation pitch Lp actually increased the breaking strength N1 to thereby reduce occurrence of unintended splits in the substrate 50. The reason for the reduction in unintended splits is believed to be the modified regions 53 which were densely formed inside the substrate 50 along the laser irradiation lines, and the densely formed modified regions are overlapped with one another, to thereby make the substrate 50 less propone to splitting.

In this embodiment, the laser irradiation pitch Lp in the first irradiation step (i.e., the first irradiation pitch Lp1) is set small. For example, the first irradiation pitch Lp1 is 2.5 μm at most. This can achieve a high breaking strength N1 and reduce unintended splits. This can achieve, for example, a stable irradiation state (i.e., the depths of focal spots) for the laser beam 61 in the second irradiation step.

In this embodiment, the first irradiation pitch Lp1 is at least 1.0 μm. This can reduce, for example, damage to the semiconductor structure 51 caused by the laser beam in the laser irradiation step. Moreover, this can prevent the time required for the laser beam irradiation step from becoming lengthy, thereby increasing production efficiency.

In this embodiment, for example, the first irradiation pitch Lp1 is preferably smaller than the second irradiation pitch Lp2. This can reduce occurrence of unintended splits in the first irradiation step.

For instance, the second irradiation pitch Lp2 is in a range of from 5.0 μm to 12.0 μm, preferably from 5.0 μm to 7.0 μm. A second irradiation pitch Lp2 of at least 5.0 μm can facilitate, for example, the formation of straight lines that serve as the starting points of separation when separating the substrate. A second irradiation pitch Lp2 of 12.0 μm at most can reduce, for example, the instances where the cracks CR formed from the modified regions 53 tend not to connect with one another, and can facilitate separation of the substrate 50.

As previously explained, in this embodiment, the first pitch P1 (pitch for the first lines L1 arranged in the second direction D2) is at least 0.7 mm. The first pitch P1 is preferably in a range of from 0.7 mm to 3 mm, more preferably from 0.9 mm to 2.5 mm, even more preferably from 1 mm to 2 mm. When the first pitch P1 is at least 0.7 mm, a relatively large force is applied to the portions of the substrate 50 where the modified regions 53 are formed, likely resulting in the formation of unintended "splits." This is believed to be attributable to the increased amount of warpage of a wafer 50W, which is generally warped by stress, between adjacent first lines L1 when the first pitch P1 increases. It is believed that this consequently likely causes unintended splits at the modified regions 53 after or during the first irradiation step. In this embodiment, the first irradiation pitch Lp1 is set small. This increases the breaking strength N1 to thereby reduce occurrence of unintended splits even when the first pitch P1 is relatively large.

As described above, the first irradiation pitch Lp1 is preferably smaller than the second irradiation pitch Lp2. At this time, in one example, the first lines L1 (first direction D1) extend along the m-axis, and the second lines L2 (second direction D2) extend along the a-axis. In another example, the first lines L1 (first direction D1) extend along the a-axis, and the second lines L2 (second direction D2) extend along the m-axis. In yet another example, the first lines L1 (first direction D1) may be oblique to the a-axis, and the second lines L2 (second direction D2) may also be oblique to the a-axis.

In this embodiment, it is particularly preferable for the first direction D1 (first lines L1) to extend along the m-axis, and the second direction D2 (second lines L2) to extend along the a-axis. This is because, as explained below, irradiating the laser beam 61 along the m-axis can facilitate the formation of straight lines (described below) which will become the starting points for separation even when the laser irradiation pitch Lp (first irradiation pitch Lp1) is small.

Examples of test results obtained by irradiating the laser beam 61 along the a-axis will be explained below.

Figure 11:
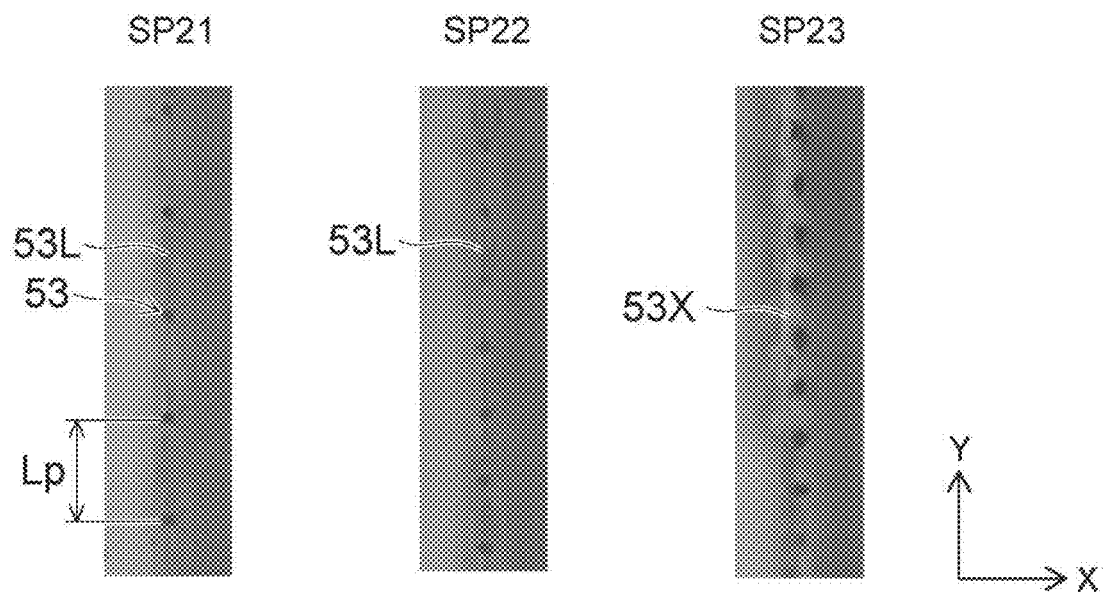
FIG. 11 includes micrographs showing an example of test results related to the light emitting element manufacturing method.
Figure 12:
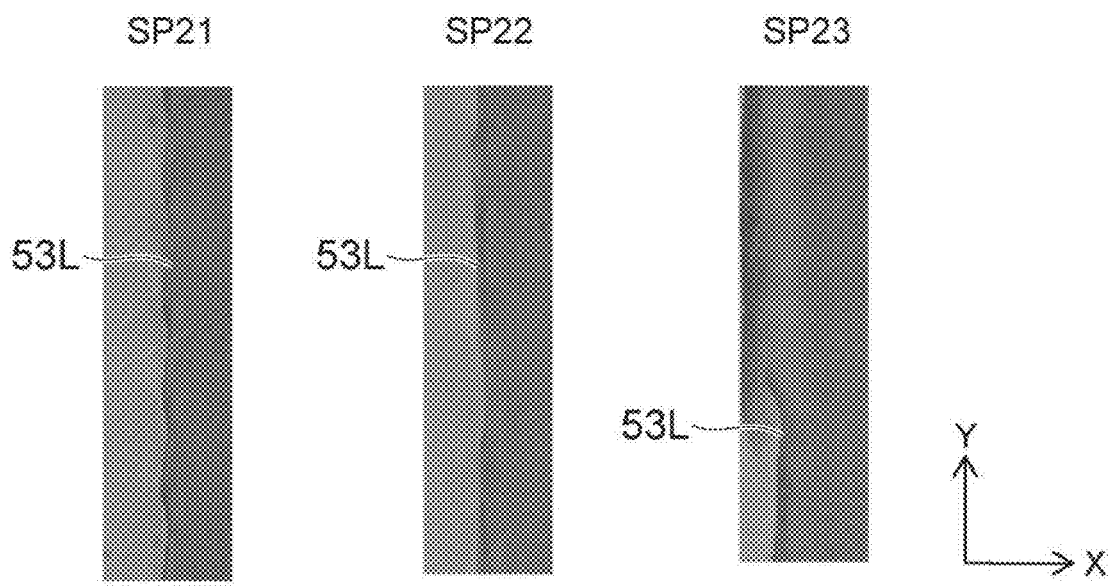
FIG. 12 includes micrographs showing an example of test results related to the light emitting element manufacturing method.

FIG. 11 and FIG. 12 are micrographs showing the results of the test related to the method of manufacturing a light emitting element.

These are micrographs of samples SP21, SP22, and SP23. Different laser irradiation pitches Lp are used for these samples. In these samples, the laser beam 61 irradiation was performed along the Y-axis direction. In this test, the Y-axis direction extends along the a-axis of the sapphire substrate. The X-axis direction extends along the m-axis of the sapphire substrate.

The laser irradiation pitch Lp used for sample SP21 is 12 μm. The laser irradiation pitch Lp used for sample SP22 is 10 μm. The laser irradiation pitch Lp used for sample SP23 is 8 μm. In FIG. 11, the focus is positioned at the depths of the modified regions 53. In FIG. 12, the focus is positioned at the surface (in this example, the first face 50a) of each substrate 50 (sapphire substrate).

As is understood from FIG. 11, lines 53L linearly connecting the modified regions 53 can be observed in sample SP21, which was processed using a large laser irradiation pitch Lp. The lines 53L are believed to correspond to cracks CR or the starting points of cracks. In sample SP22, which was processed using a moderate laser irradiation pitch Lp, lines 53L linearly connecting some of the modified regions 53 can also be observed. However, these lines 53L are bent as compared to those in sample SP21. In the case of sample SP23, which was processed by using a small laser irradiation pitch Lp, no lines 53L linearly connecting the modified regions 53 can be practically observed. In sample SP23, curved lines 53X that pass in the area surrounding of the modified regions 53 can be observed.

As is understood from FIG. 12, at the surface (first face 50a) of the sapphire substrate, clear lines 53L along the first direction D1 can be observed in sample SP21, which was processed by using a large laser irradiation pitch Lp. These lines 53L are believed to correspond to cracks CR or starting points of cracks CR. In the case of sample SP22, which was processed using a moderate laser irradiation pitch Lp, the linearity of the lines 53L is reduced, and some lines 53L are oblique to the first direction D1. In the case of sample SP23, which was processed using a small laser irradiation pitch Lp, the lines 53L are more obscure, and some lines 53L are considerably oblique to the first direction D1.

Figure 13:
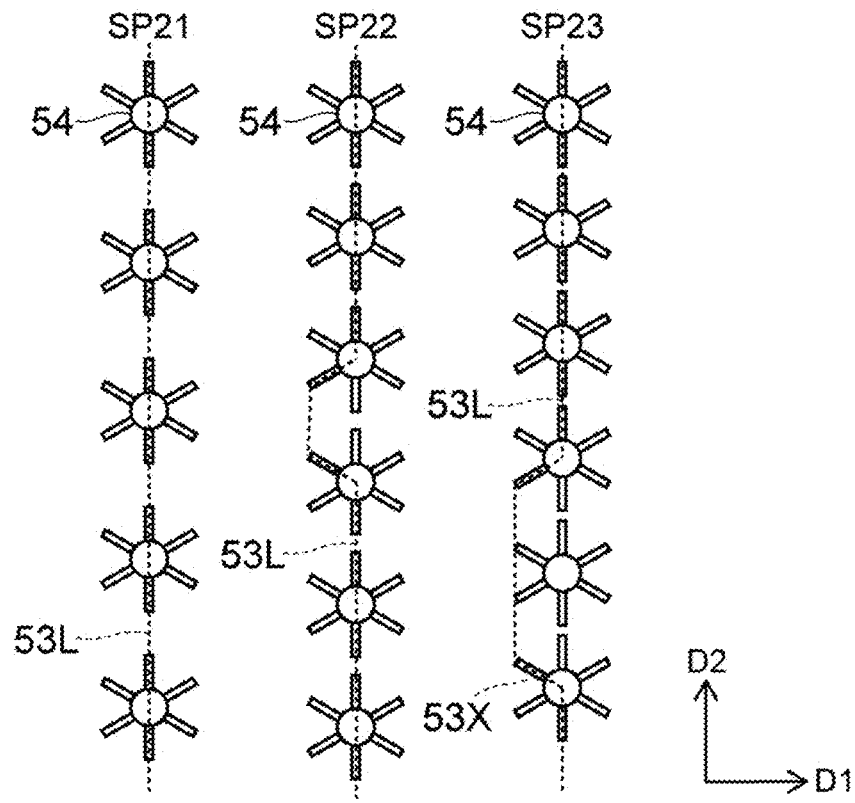
FIG. 13 is a schematic diagram showing an example of test results related to the light emitting element manufacturing method.

FIG. 13 is a schematic diagram illustrating the results of the test related to the method of manufacturing a light emitting element.

FIG. 13 schematically shows the lines 53L and lines 53X in the substrates 50 estimated from the micrographs shown in FIGS. 11 and 12.

As shown in FIG. 13, in sample SP21 processed by using a large laser irradiation pitch Lp, lines 53L are formed, connecting the sapphire crystal lattice points 54 along the second direction D2. In the case of sample SP23 processed by using a small laser irradiation pitch Lp, it is believed that lines 53X passing through sapphire crystal lattice points 54 and extending obliquely to the second direction D2 are formed, in addition to the lines 53L described above. It is believed that the case of sample SP22, processed by using a moderate laser irradiation pitch Lp, is somewhere between sample SP21 and sample SP23.

As described above, when the laser irradiation pitch Lp is large, lines 53L are formed connecting the sapphire crystal lattice points 54 along the second direction D2. In contrast, a small laser irradiation pitch Lp likely forms the lines 53X which extend obliquely to the second direction D2. Lines 53X are winding lines. When winding lines 53X are formed, the cut faces when the substrate 50 are separated, for example, might not be linear.

As described above, reducing the laser irradiation pitch Lp when irradiating the laser beam 61 along the a-axis likely causes the formation of winding lines 53X. This is believed to be a phenomenon inherent to a hexagonal crystal.

In the case of irradiating the laser beam 61 along the m-axis, on the other hand, winding lines 53X are not readily formed even when the laser irradiation pitch Lp is reduced.

From the above, in this embodiment, the laser beam 61 irradiation is preferably performed along the m-axis, but not the a-axis, during the first irradiation step which uses a small laser irradiation pitch Lp. In this case, in the second irradiation step, the laser beam 61 irradiation is preferably performed along the a-axis. In this way, the laser irradiation pitch Lp can be reduced to thereby reduce unintended splits. Furthermore, the occurrence of winding lines 53X can be reduced. As a result, a light emitting element manufacturing method that can increase production efficiency can be provided.

In this embodiment, the output of the laser beam 61 in the first irradiation step and the second irradiation is in a range of from 100 mW to 300 mW, preferably from 100 mW to 150 mW. An output higher than 300 mW might damage, for example, the semiconductor structure 51 (e.g., light emitting element 51e). An output of lower than 100 mW might hinder the formation of modified regions 53 or hinder the development of cracks starting from the modified regions 53. This makes it difficult to separate the substrate 50. When the output is in a range of from 100 mW to 300 mW, the substrate can be easily separated while reducing damages to the semiconductor structure 51.

Figure 14:
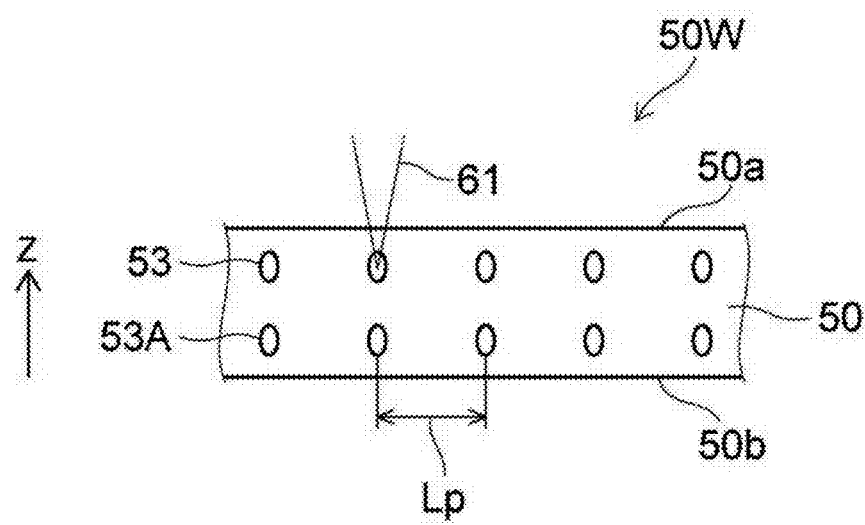
FIG. 14 is a schematic diagram showing part of another light emitting element manufacturing method according to the embodiment.

FIG. 14 is a schematic diagram illustrating part of another light emitting element manufacturing method related to the embodiment.

FIG. 14 illustrates the irradiation of the laser beam 61. In this example, the focal spots of the laser beam 61 are located at multiple depths in the substrate 50. For example, the substrate 50 is irradiated with the laser beam 61 in multiple passes. For example, the depth of the focal spots of the laser beam 61 is changed in running the laser for multiple passes. Accordingly, a group of modified regions 53 and a group of modified regions 53A are formed. The positions of the modified regions 53 in the Z-axis direction differ from the positions of the modified regions 53A in the Z-axis direction.

As such, in the first irradiation step, the laser beam 61 may be irradiated at multiple positions in the depth direction extending from the first face 50a to the second face 50b (Z-axis direction). This can reduce, for example, the occurrence of winding lines 53X in a more stable manner.

According to this embodiment, a light emitting element manufacturing method that can increase production efficiency can be provided.

The terms "perpendicular" and "parallel" herein include not only strictly perpendicular and strictly parallel, but also those that include a manufacturing tolerance, for example. The applicable parts can simply be substantially perpendicular or substantially parallel.

Certain embodiments of the present disclosure have been explained above with reference to specific examples. The present disclosure, however, is not limited to these specific examples. With respect to specific constructions of the members, such as the wafer, substrate, semiconductor structure, light emitting element, laser, and the like used in the method of manufacturing a light emitting element, for example, they fall in the scope of the present disclosure as long as one of ordinary skill in the art can practice them in a similar manner by suitably selecting the members from among those known and obtain similar effects.

Furthermore, one made by combining two or more elements from the specific examples in a technically viable manner also fall in the scope of the present disclosure as long as it encompasses the essence of the present disclosure.

Moreover, any light emitting element manufacturing method implemented by one of ordinary skill in the art by suitably applying design changes based on the light emitting element manufacturing methods described as the embodiments of the present disclosure in the forgoing fall in the scope of the present disclosure as long as they encompass the essence of the present disclosure.

Furthermore, one of ordinary skill in the art can achieve various modifications and variations without departing from the concept of the present disclosure, and these modifications and variations are understood to also fall in the scope of the present disclosure.

What is claimed is:

1. A method of manufacturing a light emitting element, the method comprising:
   providing a wafer comprising:
      a sapphire substrate having a first face and a second face, and
      a semiconductor structure disposed on the second face;
   irradiating the substrate with a laser beam to form a plurality of modified regions in the substrate; and
   subsequently, separating the wafer into a plurality of light emitting elements,
   wherein said irradiating the substrate with a laser beam comprises:
      performing a first irradiation step comprising irradiating the laser beam along a plurality of first lines that extend in a first direction that is parallel to the first face and that are aligned in a second direction that is parallel to the first face and intersects the first direction, and
      subsequent to performing the first irradiation step, performing a second irradiation step comprising irradiating the laser beam along second lines that extend in the second direction,
   wherein said irradiating in the first irradiation step is performed at a plurality of positions along the first direction using a first irradiation pitch of 2.5 µm or less for the positions along the first direction, and
   wherein said irradiating in the second irradiation step is performed at a plurality of positions along the second direction using a second irradiation pitch for the positions along the second direction, the second irradiation pitch being larger than the first irradiation pitch.

2. The method of manufacturing a light emitting element according to claim 1, wherein:
   the first direction extends along an m-axis of the sapphire, and
   the second direction extends along an a-axis of the sapphire.

3. The method of manufacturing a light emitting element according to claim 2, wherein the second face of the substrate extends in a c-plane of the sapphire.

4. The method of manufacturing a light emitting element according to claim 1, wherein the second irradiation pitch is in a range of 5.0 µm to 12.0 µm.

5. The method of manufacturing a light emitting element according to claim 2, wherein the second irradiation pitch is in a range of 5.0 µm to 12.0 µm.

6. The method of manufacturing a light emitting element according to claim 3, wherein the second irradiation pitch is in a range of 5.0 µm to 12.0 µm.

7. The method of manufacturing a light emitting element according to claim 1, wherein a laser beam output in the first irradiation step and the second irradiation step is in a range of 100 mW to 300 mW.

8. The method of manufacturing a light emitting element according to claim 2, wherein a laser beam output in the first irradiation step and the second irradiation step is in a range of 100 mW to 300 mW.

9. The method of manufacturing a light emitting element according to claim 3, wherein a laser beam output in the first irradiation step and the second irradiation step is in a range of 100 mW to 300 mW.

10. The method of manufacturing a light emitting element according to claim 1, wherein the laser beam irradiation in the first irradiation step is applied at a plurality of positions in a depth direction extending from the first face to the second face.

11. The method of manufacturing a light emitting element according to claim 2, wherein the laser beam irradiation in the first irradiation step is applied at a plurality of positions in a depth direction extending from the first face to the second face.

12. The method of manufacturing a light emitting element according to claim 3, wherein the laser beam irradiation in the first irradiation step is applied at a plurality of positions in a depth direction extending from the first face to the second face.

13. The method of manufacturing a light emitting element according to claim 4, wherein the laser beam irradiation in the first irradiation step is applied at a plurality of positions in a depth direction extending from the first face to the second face.

14. The method of manufacturing a light emitting element according to claim 7, wherein the laser beam irradiation in the first irradiation step is applied at a plurality of positions in a depth direction extending from the first face to the second face.

15. The method of manufacturing a light emitting element according to claim 1, wherein the semiconductor structure made of a nitride semiconductor.

16. The method of manufacturing a light emitting element according to claim 2, wherein the semiconductor structure made of a nitride semiconductor.

17. The method of manufacturing a light emitting element according to claim 3, wherein the semiconductor structure made of a nitride semiconductor.

18. The method of manufacturing a light emitting element according to claim 15, wherein said irradiating in the first irradiation step is performed using a pitch of at least 0.7 mm for the first lines aligned in the second direction.

19. The method of manufacturing a light emitting element according to claim 16, wherein said irradiating in the first irradiation step is performed using a pitch of at least 0.7 mm for the first lines aligned in the second direction.

20. The method of manufacturing a light emitting element according to claim 17, wherein said irradiating in the first irradiation step is performed using a pitch of at least 0.7 mm for the first lines aligned in the second direction.

\* \* \* \* \*